United States Patent
Eguchi et al.

(10) Patent No.: US 10,002,974 B2
(45) Date of Patent: Jun. 19, 2018

(54) ZENER DIODE

(71) Applicant: TOYOTA JIDOSHA KABUSHIKI KAISHA, Toyota-shi, Aichi-ken (JP)

(72) Inventors: Hiroomi Eguchi, Seto (JP); Hiromichi Kinpara, Seto (JP); Takashi Okawa, Miyoshi (JP); Satoshi Ikeda, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 64 days.

(21) Appl. No.: 15/030,735

(22) PCT Filed: Oct. 30, 2014

(86) PCT No.: PCT/IB2014/002269
§ 371 (c)(1),
(2) Date: Apr. 20, 2016

(87) PCT Pub. No.: WO2015/063574
PCT Pub. Date: May 7, 2015

(65) Prior Publication Data
US 2016/0254390 A1    Sep. 1, 2016

(30) Foreign Application Priority Data
Oct. 31, 2013  (JP) .................. 2013-227332

(51) Int. Cl.
| | | |
|---|---|---|
| H01L 29/866 | (2006.01) | |
| H01L 29/36 | (2006.01) | |
| H01L 29/06 | (2006.01) | |

(52) U.S. Cl.
CPC ........ *H01L 29/866* (2013.01); *H01L 29/0626* (2013.01); *H01L 29/0649* (2013.01); *H01L 29/36* (2013.01)

(58) Field of Classification Search
CPC ............. H01L 29/0626; H01L 29/0649; H01L 29/0834; H01L 29/0839; H01L 29/36;
(Continued)

(56) References Cited

U.S. PATENT DOCUMENTS

| | | | |
|---|---|---|---|
| 5,834,823 A | 11/1998 | Honda | |
| 2007/0158678 A1* | 7/2007 | Udrea | ................. H01L 29/0834 257/119 |

(Continued)

FOREIGN PATENT DOCUMENTS

| | | |
|---|---|---|
| JP | H07-321347 A | 12/1995 |
| JP | H10-242159 A | 9/1998 |

(Continued)

OTHER PUBLICATIONS

Donald A. Neamen, Semiconductor Physics and Devices: Basic Principles, 2012, McGraw-Hill Companies, Inc, Fourth Edition, Chapter 7, The pn Junction, pp. 242-262.*

(Continued)

*Primary Examiner* — Yu Chen
*Assistant Examiner* — Scott Bauman
(74) *Attorney, Agent, or Firm* — Oliff PLC (57) ABSTRACT

A Zener diode includes a semiconductor substrate, an anode electrode and a cathode electrode. The semiconductor substrate includes a p-type anode region, an n-type current path region and a drift region. The p-type anode region is connected to the anode electrode. The n-type current path region is in contact with the anode region. The drift region is in contact with the anode region and the current path region. The drift region is of an n type. The drift region has a lower n-type impurity concentration than the current path region. The drift region is connected to the cathode electrode directly or via another n-type region.

3 Claims, 5 Drawing Sheets

(58) Field of Classification Search
CPC ............ H01L 29/866; H01L 29/66113; H01L 29/7313; H01L 29/7886; H01L 31/02027; H01L 31/107; H01L 29/7808; H01L 29/7821; H01L 29/66106; H01L 2924/12035; H01L 29/66136
USPC ........................................................ 257/603
See application file for complete search history.

(56) References Cited

U.S. PATENT DOCUMENTS

2010/0117097 A1   5/2010   Domeij
2011/0175199 A1*  7/2011   Lin ..................... H01L 29/0646
                                                         257/605
2013/0082768 A1   4/2013   Hirler et al.

FOREIGN PATENT DOCUMENTS

| | | |
|---|---|---|
| JP | H11-186569 A | 7/1999 |
| JP | 2009-141019 A | 6/2009 |
| JP | 2013-149768 A | 8/2013 |
| JP | 2013-183039 A | 9/2013 |

OTHER PUBLICATIONS

Merchant et al, Realization of high breakdown voltage (>700V) in thin SOI devices, Apr. 1991, Proceedings of the 3rd International Symposium on Power Semiconductor Devices and ICs, pp. 31-35.*

* cited by examiner

ZENER DIODE

BACKGROUND OF THE INVENTION

1. Field of the Invention

The invention relates to a Zener diode.

2. Description of Related Art

Japanese Patent Application Publication No. 7-321347 (JP 7-321347 A) describes a Zener diode. An n-type impurity concentration of an n region that constitutes a pn junction of a Zener diode is low, an avalanche breakdown mainly occurs at the time of a breakdown of the Zener diode. In this case, the avalanche breakdown has a positive temperature coefficient, so the characteristic of the Zener diode changes depending on temperature. In contrast, in the Zener diode described in JP 7-321347 A, a pn junction is formed of a high-concentration p region and a high-concentration n region. Thus, both an avalanche breakdown and a Zener breakdown occur in a balanced manner at the time of a breakdown of the Zener diode. A Zener breakdown has a temperature coefficient opposite to an avalanche breakdown. Therefore, by causing both an avalanche breakdown and a Zener breakdown to occur, it is possible to improve the temperature characteristic of the Zener diode.

SUMMARY OF THE INVENTION

In the Zener diode described in JP 7-321347 A, the n-type impurity concentration of the n-type region that constitutes the pn junction is high. Therefore, when a reverse voltage is applied to the Zener diode, a depletion layer is difficult to extend into the n-type region. Therefore, the Zener diode has such an inconvenience that a reverse breakdown voltage is low. Thus, the invention provides a Zener diode having a desired temperature characteristic and a high reverse breakdown voltage.

An aspect of the invention provides a Zener diode. The Zener diode includes a semiconductor substrate, an anode electrode and a cathode electrode. The semiconductor substrate includes a p-type anode region, an n-type current path region and a drift region. The p-type anode region is connected to the anode electrode. The n-type current path region is in contact with the anode region. The drift region is in contact with the anode region and the current path region. The drift region is of an n type. The drift region has a lower n-type impurity concentration than the current path region. The drift region is connected to the cathode electrode. The drift region may be connected to the cathode electrode directly. Alternatively, the drift region may be connected to the cathode electrode via another n-type region.

In the Zener diode, a first pn junction is formed between the anode region and the current path region, and a second pn junction is formed between the anode region and the drift region. While a low reverse voltage is applied to the Zener diode, a depletion layer extends from the first and second pn junctions. At this time, because the n-type impurity concentration of the drift region is low, a depletion layer extends from the second pn junction into the drift region more widely. Therefore, a high reverse voltage is difficult to be applied to the pn junctions. Thus, the Zener diode has a high reverse breakdown voltage.

The current path region that constitutes the first pn junction has a higher n-type impurity concentration than the drift region that constitutes the second pn junction. Therefore, at the time when a reverse voltage is applied to the Zener diode, a breakdown of the first pn junction more easily occurs than a breakdown of the second pn junction. Thus, when a reverse voltage that is applied to the Zener diode increases, a breakdown of the first pn junction occurs. Because the n-type impurity concentration of the current path region that constitutes the first pn junction is high, both an avalanche breakdown and a Zener breakdown occur in a balanced manner at the first pn junction. Therefore, the Zener diode has a desired temperature characteristic.

In the above-described Zener diode, the semiconductor substrate may be an SOI substrate. The SOI substrate may include a first semiconductor layer, an insulating layer and a second semiconductor layer. The insulating layer may be laminated on the first semiconductor layer. The second semiconductor layer may be laminated on the insulating layer. In this case, the anode region, the current path region and the drift region may be formed in the second semiconductor layer. The first semiconductor layer may be connected to the cathode electrode.

With this configuration, in a state where the Zener diode is turned off, equipotential lines extend along the first semiconductor layer in the drift region. Thus, a breakdown of the first pn junction more easily occurs.

In the above-described Zener diode, the current path region may be formed on a lower side of the anode region.

With this configuration, it is possible to accurately form the current path region. Therefore, the characteristic of the Zener diode becomes stable in mass production.

In the above-described Zener diode, the semiconductor substrate may include a cathode region and an intermediate concentration region. The cathode region may be connected to the cathode electrode. The cathode region may be of an n type. The cathode region may have a higher n-type impurity concentration than the drift region. The intermediate concentration region may be in contact with the cathode region and the drift region. The intermediate concentration region may isolate the cathode region from the drift region. The intermediate concentration region may be of an n type. The intermediate concentration region may have a lower n-type impurity concentration than the cathode region. The intermediate concentration region may have a higher n-type impurity concentration than the drift region.

With this configuration, in a state where the Zener diode is turned off, a high electric field is difficult to be generated in the semiconductor substrate. Thus, it is possible to further increase a breakdown voltage of the Zener diode.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
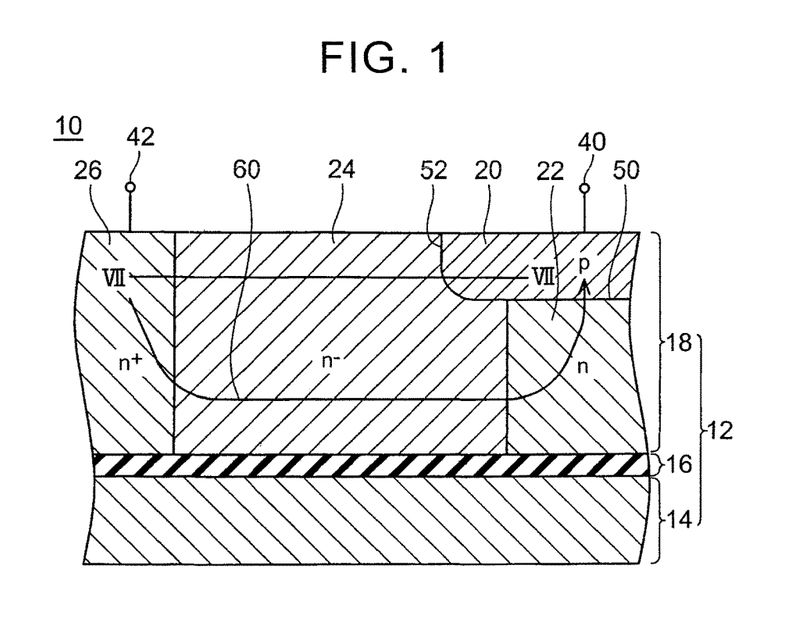
FIG. 1 is a longitudinal cross-sectional view of a Zener diode according to a first embodiment.

A Zener diode 10 shown in FIG. 1 includes an SOI substrate 12, an anode electrode 40 and a cathode electrode 42. The SOI substrate 12 includes a back surface layer 14, an insulating layer 16 and a surface layer 18. The back surface layer 14 is made of silicon. The insulating layer 16 is made of silicon oxide. The insulating layer 16 is laminated on the back surface layer 14. The surface layer 18 is made of silicon. The surface layer 18 is laminated on the insulating layer 16. The surface layer 18 is insulated from the back surface layer 14 by the insulating layer 16. The anode electrode 40 and the cathode electrode 42 are formed on the surface layer 18.

Figure 9:
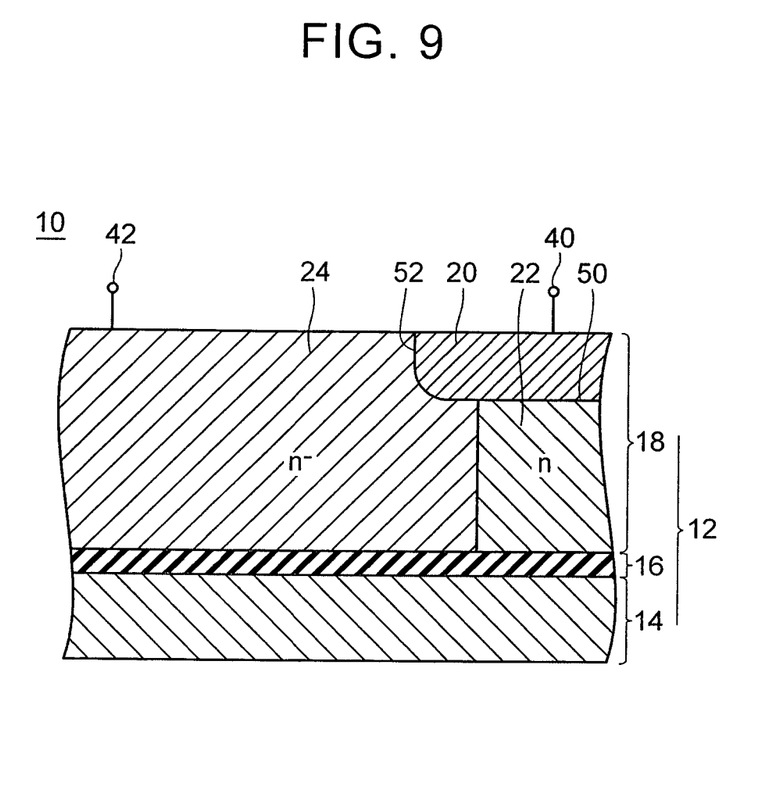
FIG. 9 is a longitudinal cross-sectional view of a Zener diode according to a variation of the first embodiment.

An anode region 20, a current path region 22, a drift region 24 and a cathode region 26 are formed in the surface layer 18. The anode region 20 is a p-type region, and is formed in a region that is exposed to the upper face of the surface layer 18. The anode region 20 is connected to the anode electrode 40. The current path region 22 is an n-type region, and is formed on the lower side of the anode region 20. The current path region 22 is in contact with the anode region 20. The drift region 24 is an n-type region having a lower n-type impurity concentration than the current path region 22. The drift region 24 is in contact with the anode region 20 and the current path region 22. The cathode region 26 is an n-type region having a higher n-type impurity concentration than the current path region 22 and the drift region 24. The cathode region 26 is in contact with the drift region 24. The cathode region 26 is isolated from the anode region 20 and the current path region 22 by the drift region 24. The cathode region 26 is connected to the cathode electrode 42. In the following description, a pn junction formed of the anode region 20 and the current path region 22 is referred to as pn junction 50, and a pn junction formed of the anode region 20 and the drift region 24 is referred to as pn junction 52. As shown in FIG. 9, the drift region 24 may be connected to the cathode electrode 42.

N-type impurities are distributed in the drift region 24 at substantially a constant concentration. The current path region 22 is a region formed by injecting n-type impurities into the drift region 24. Thus, the n-type impurity concentration of the current path region 22 is higher than the substantially uniform n-type impurity concentration of the drift region 24. The cathode region 26 is a region formed by injecting n-type impurities into the drift region 24. Thus, the n-type impurity concentration of the cathode region 26 is higher than the substantially uniform n-type impurity concentration of the drift region 24. That is, a region that is in contact with the anode region 20 and that has a uniform n-type impurity concentration is the drift region 24. A region that is in contact with the anode region 20 and that has a higher n-type impurity concentration than the drift region 24 is the current path region 22. A region that has a higher n-type impurity concentration than the drift region 24 and that is isolated from the anode region 20 and the current path, region 22 by the drift region 24 is the cathode region 26. In the present embodiment, the n-type impurity concentration of the drift region 24 is lower than $1\times10^{15}$ atoms/cm$^3$. The n-type impurity concentration of the current path region 22 is higher than or equal to $4\times10^{17}$ atoms/cm$^3$. The n-type impurity concentration of the current path region 22 is preferably lower than $6\times10^{17}$ atoms/cm$^3$. The n-type impurity concentration of the cathode region 26 is higher than or equal to $1\times10^{20}$ atoms/cm$^3$.

During usage of the Zener diode 10, a voltage of which the cathode electrode 42 is positive (that is, reverse voltage) may be applied between the anode electrode 40 and the cathode electrode 42. When a reverse voltage is applied, a depletion layer extends from the pn junction 50 into the current path region 22 and extends from the pn junction 52 into the drift region 24. At this time, because the n-type impurity concentration of the drift region 24 is lower than that of the current path region 22, the depletion layer extends into the drift region 24 more widely. As a result, substantially the entire drift region 24 is depleted. Because a relatively high voltage is applied to the depleted drift region 24, a voltage is difficult to be applied to the pn junctions 50, 52. Therefore, a breakdown of the pn junctions 50, 52 is difficult to occur, so the reverse breakdown voltage of the Zener diode 10 is high.

The current path region 22 has a high n-type impurity concentration, so the pn junction 50 has a high built-in potential. In contrast, the drift region 24 has a low n-type impurity concentration, so the pn junction 52 has a low built-in potential. Therefore, a breakdown of the pn junction 50 more easily occurs than that of the pn junction 52. Thus, when the above-described reverse voltage is further increased, a breakdown of the pn junction 50 occurs prior to that of the pn junction 52. With this, as indicated by the arrow 60 in FIG. 1, a breakdown current flows from the cathode region 26 via the drift region 24 and the current path region 22 to the anode region 20. At this time, because the current path region 22 has a high n-type impurity concentration, both an avalanche breakdown and a Zener breakdown occur at the pn junction 50 at substantially the same ratio. An avalanche breakdown has a positive temperature coefficient and a Zener breakdown has a negative temperature coefficient, so these temperature coefficients cancel each other. Thus, the Zener diode 10 has an excellent temperature characteristic. That is, the characteristic of the Zener diode 10 is difficult to change even when the temperature changes.

As described above, with the configuration according to the first embodiment, it is possible to implement the Zener diode 10 having a high reverse breakdown voltage and an excellent temperature characteristic.

Figure 2:
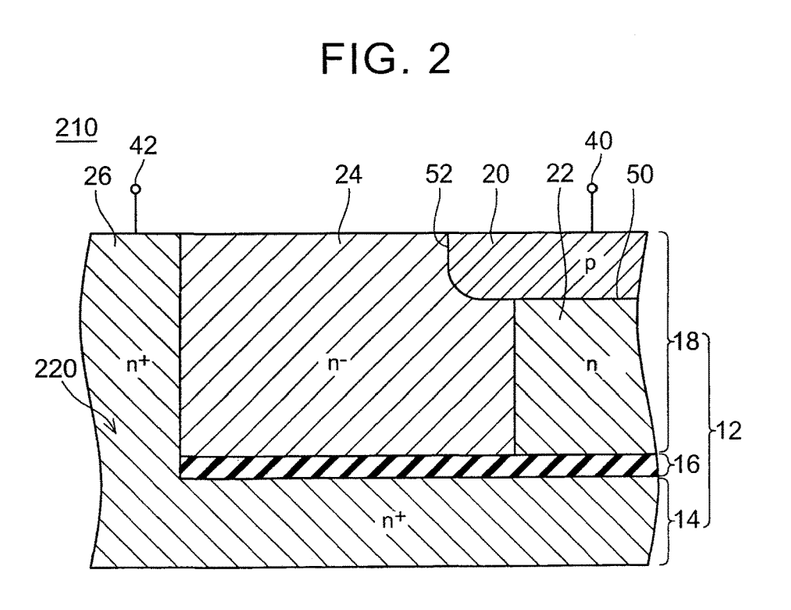
FIG. 2 is a longitudinal cross-sectional view of a Zener diode according to a second embodiment.

A second embodiment will be described. In a Zener diode 210 shown in FIG. 2, an opening 220 is formed in the insulating layer 16 on the lower side of the cathode region 26. The back surface layer 14 is connected to the surface layer 18 via the opening 220. The back surface layer 14 is formed of an n-type semiconductor having high-concentration n-type impurities. The cathode region 26 reaches the back surface layer 14 through the opening 220. Therefore, in the Zener diode 210, the back surface layer 14 is connected to the cathode electrode 42 via the cathode region 26. The other configuration of the Zener diode 210 is the same as that of the Zener diode 10 according to the first embodiment.

Figure 3:
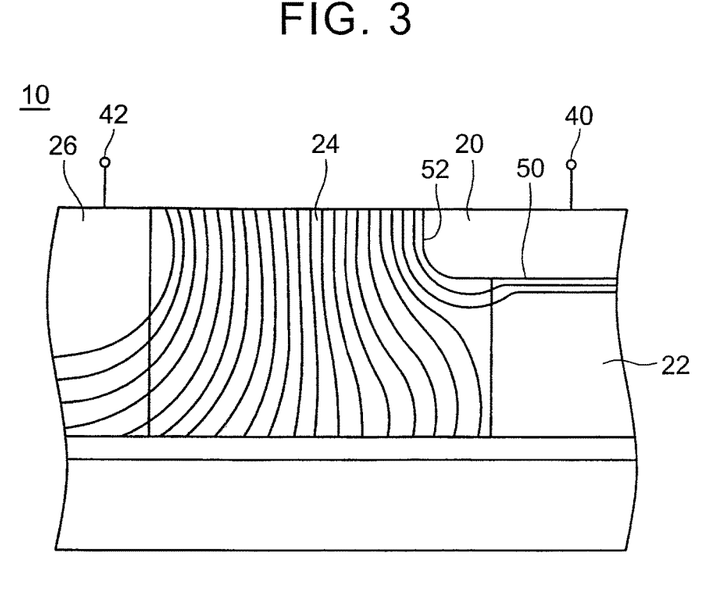
FIG. 3 is a view that shows a potential distribution in the Zener diode according to the first embodiment.
Figure 4:
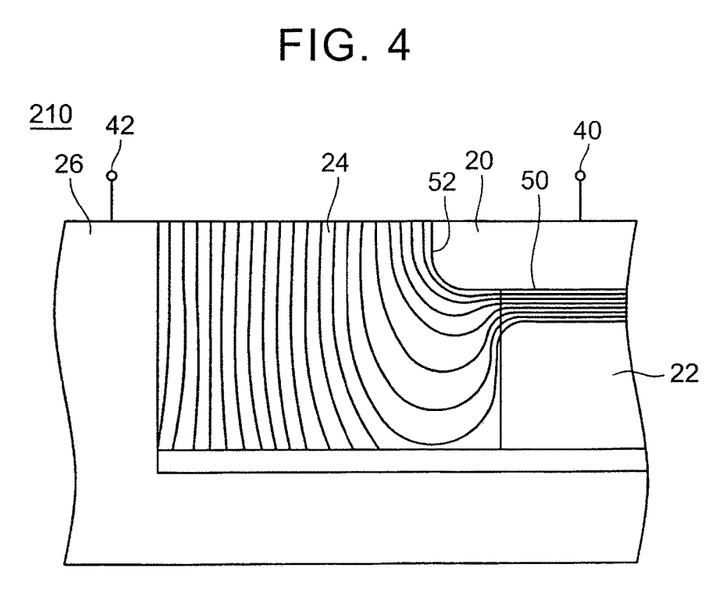
FIG. 4 is a potential distribution in the Zener diode according to the second embodiment.

FIG. 3 shows a distribution of equipotential lines in the Zener diode 10 according to the first embodiment in the case where a reverse voltage having a level at which no breakdown of the pn junctions 50, 52 occurs is applied. FIG. 4 shows a distribution of equipotential lines in the Zener diode 210 according to the second embodiment in the case where the same reverse voltage as that of FIG. 3 is applied. As is apparent from FIG. 3 and FIG. 4, a higher voltage is applied to the pn junction 50 in the Zener diode 210 according to the second embodiment than to the pn junction 50 in the Zener diode 10 according to the first embodiment. Therefore, when a higher reverse voltage is applied, it is possible to further reliably cause a breakdown of the pn junction 50 to occur. Thus, robustness in mass production of a Zener diode improves. That is, even when there occurs a misalignment in arrangement of the regions due to a manufacturing error, it is possible to manufacture a Zener diode in which a breakdown of the pn junction 50 reliably occurs.

A third embodiment will be described. In a Zener diode 310 according to a third embodiment shown in FIG. 5, a hole 70 is formed next to the cathode region 26. The hole 70 extends through the surface layer 18 and the insulating layer 16, and reaches the back surface layer 14. The side face of the hole 70 is covered with an insulating film 72. A conductive layer 74 is formed in the hole 70. The conductive layer 74 is insulated from the semiconductor layer of the surface layer 18 by the insulating film 72. The conductive layer 74 is connected to the cathode electrode 42. The back surface layer 14 is formed of an n-type semiconductor having high-concentration n-type impurities. The back surface layer 14 is in contact with the conductive layer 74. That is, the back surface layer 14 is connected to the cathode electrode 42 via the conductive layer 74. The other configuration of the Zener diode 310 is the same as that of the Zener diode 10 according to the first embodiment.

Figure 5:
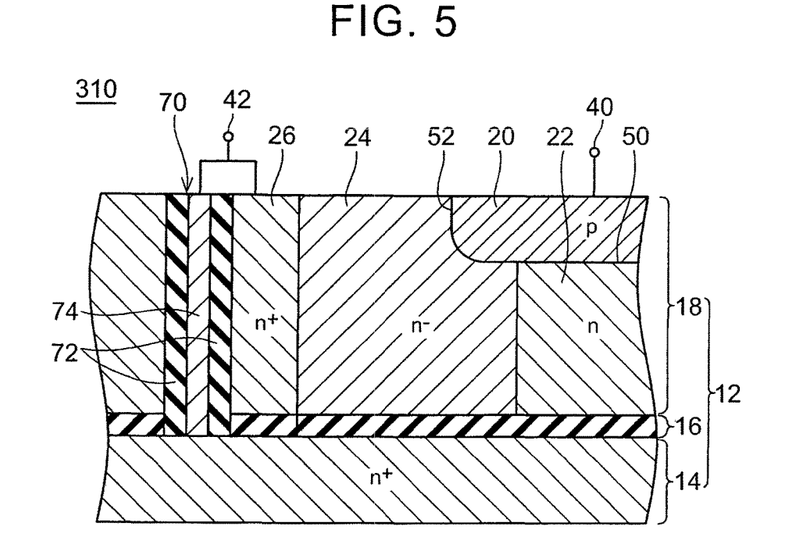
FIG. 5 is a longitudinal cross-sectional view of a Zener diode according to a third embodiment.

In the Zener diode 310 according to the third embodiment, as well as the Zener diode 210 according to the second embodiment, the back surface layer 14 is connected to the cathode electrode 42. Thus, in the Zener diode 310 as well, a breakdown of the pn junction 50 is easy to occur.

A fourth embodiment will be described. In a Zener diode 410 according to a fourth embodiment shown in FIG. 6, four intermediate concentration regions 401 to 404 are formed between the drift region 24 and the cathode region 26. Each of an n-type impurity concentration n1 of the intermediate concentration region 401, an n-type impurity concentration n2 of the intermediate concentration region 402, an n-type impurity concentration n3 of the intermediate concentration region 403 and an n-type impurity concentration n4 of the intermediate concentration region 404 is lower than the n-type impurity concentration of the cathode region 26, and is higher than the n-type impurity concentration of the drift region 24. The n-type impurity concentrations n1 to n4 satisfy the relationship n1>n2>n3>n4. That is, a region closer to the cathode region 26 among the intermediate concentration regions 401 to 404 has a higher n-type impurity concentration. In the fourth embodiment, the n-type impurity concentration of each of the intermediate concentration regions 401 to 404 is lower than $1\times10^{20}$ atoms/cm$^3$ and higher than or equal to $1\times10^{15}$ atoms/cm$^3$. The other configuration of the Zener diode 410 is the same as that of the Zener diode 10 according to the first embodiment.

Figure 6:
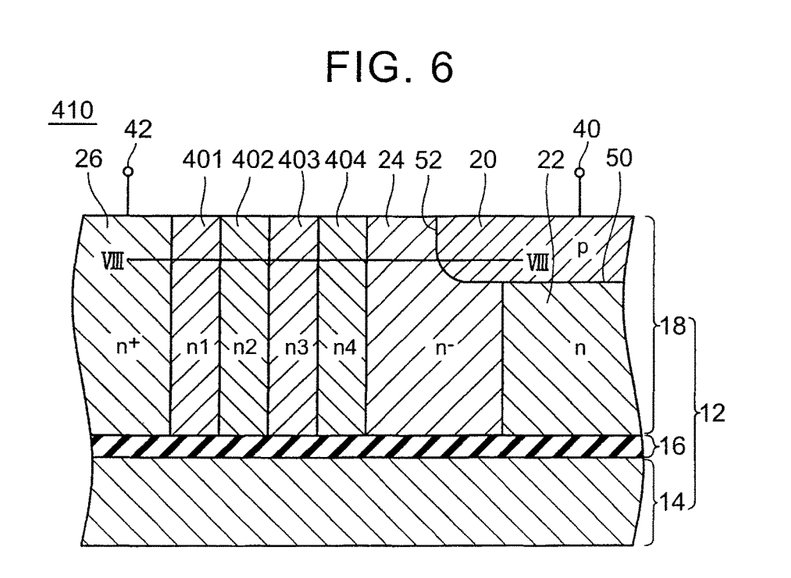
FIG. 6 is a longitudinal cross-sectional view of a Zener diode according to a fourth embodiment.
Figure 7:
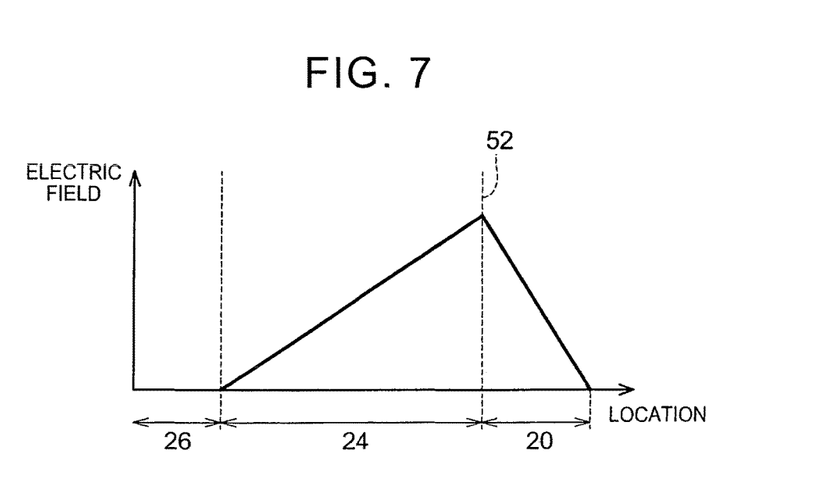
FIG. 7 is a graph that shows an electric field distribution in the Zener diode according to the first embodiment.
Figure 8:
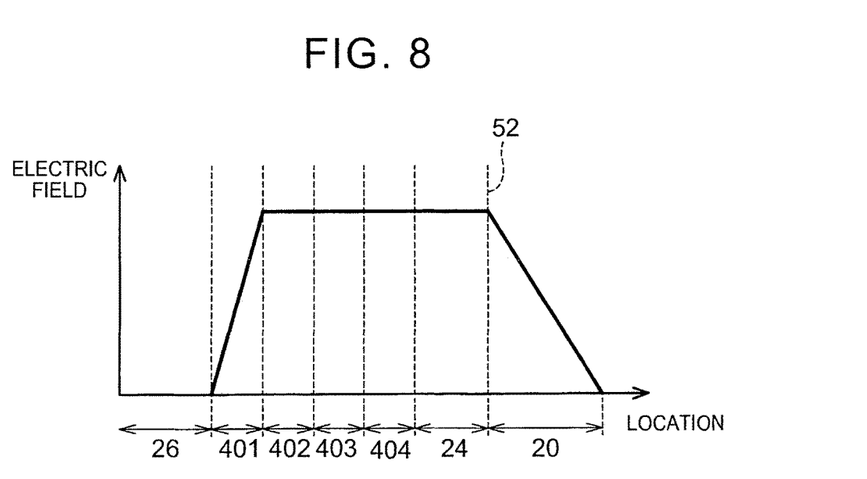
FIG. 8 is a graph that shows an electric field distribution in the Zener diode according to the fourth embodiment.

In the Zener diode 410, when a reverse voltage having a level at which no breakdown of the pn junctions 50, 52 occurs is applied, substantially the entire drift region 24 and the entire intermediate concentration regions 401 to 404 are depleted. FIG. 7 shows an electric field distribution along the line VII-VII in FIG. 1 in the case where the drift region 24 is depleted in the Zener diode 10 according to the first embodiment. FIG. 8 shows an electric field distribution along the line VIII-VIII in FIG. 6 in the case where the drift region 24 and the intermediate concentration regions 401 to 404 are depleted in the Zener diode 410 according to the fourth embodiment. As shown in FIG. 7, in the Zener diode 10 according to the first embodiment, an electric field becomes a peak at the pn junction 52. In contrast, in the Zener diode 410 according to the fourth embodiment, an electric field is substantially uniformly distributed in the drift region 24 and the intermediate concentration regions 401 to 404. This is because each of the intermediate concentration regions 401 to 404 has a higher n-type impurity concentration than the drift region 24. In addition, because a region closer to the cathode region 26 among the intermediate concentration regions 401 to 404 has a higher n-type impurity concentration, an electric field distribution is uniformed. The area (integral value) of each of the graphs shown in FIG. 7 and FIG. 8 means a withstanding voltage between the anode region 20 and the cathode region 26. That is, as the area increases, the reverse breakdown voltage of the Zener diode increases. As is apparent from FIG. 7 and FIG. 8, the Zener diode 410 according to the fourth embodiment has a higher reverse breakdown voltage than the Zener diode 10 according to the first embodiment. In other words, with the structure according to the fourth embodiment, even when the distance between the anode region 20 and the cathode region 26 is reduced, it is possible to obtain the reverse breakdown voltage equivalent to that of the Zener diode 10 according to the first embodiment. Thus, with the structure according to the fourth embodiment, it is possible to reduce the size of the Zener diode.

The Zener diode 410 according to the fourth embodiment includes the four intermediate concentration regions 401 to 404. However, at least one intermediate concentration region just needs to be formed.

The Zener diodes according to the first to fourth embodiments are formed by using the SOI substrate. However, these Zener diodes may be formed by using another substrate, such as a silicon bulk substrate.

In the above-described first to fourth embodiments, the current path region 22 is formed on the lower side of the anode region 20. However, as long as the current path region 22 is in contact with the anode region 20, the current path region 22 may be formed at any location. For example, the current path region 22 may be formed in a region that is exposed to the upper face of the SOI substrate 12 and that is adjacent to the anode region 20. However, the current path region 22 is preferably formed on the lower side of the anode region 20. The current path region 22 is formed by injecting impurities as described above. The accuracy of the depth direction (the thickness direction of the substrate) of injection of impurities is high, whereas the accuracy of the lateral direction (direction along the surface of the substrate) of injection of impurities is not so high. This is because there occurs a positional deviation, or the like, in a mask that is used at the time of injection of impurities. When the current path region 22 is arranged on the lower side of the anode region 20, injection of ions is difficult to be influenced by a manufacturing error, and it is possible to easily arrange the anode region 20 and the current path region 22 adjacent to each other. With this configuration, it is possible to easily manufacture the Zener diode.

In the Zener diodes according to the first to fourth embodiments, the reverse breakdown voltage changes depending on the distance between the anode region 20 and the cathode region 26. Therefore, during manufacturing, only by changing the distance between the anode region 20 and the cathode region 26, it is possible to change the reverse breakdown voltage without an additional process.

Specific embodiments of the invention are described in detail above. However, these are only illustrative, and do not limit the scope of the appended claims. The technique recited in the appended claims includes various modifications and alterations of the specific embodiments illustrated above. The technical elements described in the specification or drawings exercise technical usefulness alone or in various combinations, and are not limited to the combinations described in the claims at the time of filing. The technique illustrated in the specification or the drawings achieves multiple purposes at the same time, and has a technical usefulness by achieving one of the purposes.

The invention claimed is:
1. A Zener diode comprising:
a semiconductor substrate, the semiconductor substrate including:
a first semiconductor layer,
an insulating layer, and
a second semiconductor layer;
a cathode electrode; and
an anode electrode,
wherein the insulating layer is laminated on the first semiconductor layer, and the second semiconductor layer is laminated on the insulating layer, and
wherein the second semiconductor layer includes:
an anode region which is of a p-type,
a current path region which is of an n-type,
a drift region which is of an n-type, and
a cathode region which is of an n-type,
the anode region being connected to the anode electrode,
the current path region being in contact with the anode region,
the drift region being in contact with the anode region and the current path region,
the drift region having a lower n-type impurity concentration than the current path region,
the cathode region being connected to the cathode electrode,
the cathode region being in contact with the drift region,
the drift region isolating the cathode region from the anode region and the current path region,
the cathode region having a higher n-type impurity concentration than the drift region, and
the drift region being depleted entirely by a reverse voltage applied, the reverse voltage being lower than a reverse breakdown voltage of the Zener diode,
wherein the first semiconductor layer is an n-type layer and is connected to the cathode electrode, and
wherein the first semiconductor layer is directly connected to the cathode region.
2. The Zener diode according to claim 1, wherein
the semiconductor substrate is an SOI substrate,
the current path region is formed on a lower side of the anode region,
the insulating layer is formed on a lower side of the current path region, and
the first semiconductor layer is formed on a lower side of the insulating layer.
3. The Zener diode according to claim 1, wherein
an n-type impurity concentration of the drift region is lower than $1 \times 10^{15}$ atoms/cm$^3$.

* * * * *